United States Patent [19]
Foster et al.

[11] Patent Number: 6,054,248
[45] Date of Patent: Apr. 25, 2000

[54] HYDROXY-DIISOCYANATE THERMALLY CURED UNDERCOAT FOR 193 NM LITHOGRAPHY

[75] Inventors: Patrick Foster, Providence; Sydney George Slater, Cumberland; Thomas Steinhäusler, Riverside, all of R.I.; Andrew J. Blakeney, Seekonk, Mass.; John Joseph Biafore, Providence, R.I.

[73] Assignee: Arch Specialty Chemicals, Inc., Norwalk, Conn.

[21] Appl. No.: 09/268,431

[22] Filed: Mar. 12, 1999

[51] Int. Cl.$^7$ ........................................................ G03C 1/76
[52] U.S. Cl. ..................... 430/271.1; 430/270.1; 430/272.1; 430/910
[58] Field of Search ................................ 430/270.1, 910, 430/271.1, 272.1; 427/447

[56] References Cited

U.S. PATENT DOCUMENTS

| | | |
|---|---|---|
| 4,072,770 | 2/1978 | Ting . |
| 4,189,320 | 2/1980 | Hsieh . |
| 4,224,399 | 9/1980 | Merrill et al. . |
| 4,490,417 | 12/1984 | Shindow et al. ............... 427/388.3 |
| 4,533,975 | 8/1985 | Bill . |
| 4,690,987 | 9/1987 | Sakakibara et al. . |
| 5,177,120 | 1/1993 | Hare et al. . |
| 5,232,813 | 8/1993 | Okuno et al. ............... 430/156 |
| 5,473,048 | 12/1995 | Sarkar ............... 528/376 |
| 5,492,793 | 2/1996 | Breyta et al. . |
| 5,747,622 | 5/1998 | Maeda et al. . |
| 5,759,631 | 6/1998 | Rink et al. . |
| 5,849,835 | 12/1998 | Das et al. ............... 524/590 |
| 5,866,294 | 2/1999 | Oguni et al. ............... 430/166 |

FOREIGN PATENT DOCUMENTS 63-186773  8/1988  Japan .

*Primary Examiner*—Janet Baxter
*Assistant Examiner*—Yvette M. Clarke
*Attorney, Agent, or Firm*—Ohlandt, Greeley, Ruggiero & Perle

[57] ABSTRACT

The present invention is directed to a thermally curable polymer composition comprising a hydroxyl-containing polymer and a polyfunctional isocyanate as a crosslinking agent, which is particularly useful in photolithographic coating of substrates. The thermally curable polymer composition may be dissolved in a solvent and used as an undercoat layer in deep UV lithography. Furthermore, the present invention further relates to a process for using the photolithographic coated substrate for the production of relief structures.

23 Claims, No Drawings

6,054,248

HYDROXY-DIISOCYANATE THERMALLY CURED UNDERCOAT FOR 193 NM LITHOGRAPHY

FIELD OF THE INVENTION

The present invention relates to deep UV lithography used in semiconductor manufacturing and more particularly to undercoat layers for chemically amplified bilayer resist systems.

BACKGROUND TO THE INVENTION

Integrated circuit production relies on the use of photolithographic processes to define the active elements and interconnecting structures on microelectronic devices. Until recently, g-line (436 nm) and I-line (365 nm) wavelengths of light have been used for the bulk of microlithographic applications. However, in order to achieve smaller dimensions of resolution, the wavelength of light used for microlithography in semiconductor manufacturing has been reduced into the deep UV regions of 256 nm and 193 nm. The problem with using deep UV wavelengths is that resists used at the higher wavelengths were too absorbent and insensitive. Thus, in order to utilize deep UV light wavelengths, new resist materials with low optical absorption and enhanced sensitivities were needed.

Chemically amplified resist materials have recently been developed through the use of acid-labile polymers in order to meet the above-mentioned criteria. They have shown great promise in increasing resolution. However, chemically amplified resist systems have many shortcomings. One problem is standing wave effects, which occur when monochromatic deep UV light is reflected off the surface of a reflective substrate during exposure. The formation of standing waves in the resist reduces resolution and causes linewidth variations. For example, standing waves in a positive resist have a tendency to result in a foot at the resist/substrate interface reducing the resolution of the resist.

In addition, chemically amplified resist profiles and resolution may change due to substrate poisoning. Particularly, this effect occurs when the substrate has a nitride layer. It is believed that the N—H bond in the nitride film deactivates the acid at the nitride/resist interface. For a positive resist, this results in an insoluble area, and either resist scumming, or a foot at the resist/substrate interface.

Furthermore, lithographic aspect ratios require the chemically amplified resist layer be thin, e.g., about 0.5 $\mu$m, to print sub 0.18 $\mu$m features. This in turn requires the resist to have excellent plasma etch resistance such that resist image features can be transferred down into the underlying substrate. However, in order to decrease absorbance of the chemically amplified resist, aromatic groups, such as those in novolaks had to be removed, which in turn decreased the etch resistance.

Utilizing an underlayer or undercoat film that is placed on the substrate before the chemical amplified film is applied can reduce the above-mentioned problems. The undercoat absorbs most of the deep UV light attenuating standing wave effects. In addition, the undercoat prevents deactivation of the acid catalyst at the resist/substrate interface. Furthermore, the undercoat layer can contain some aromatic groups to provide etch resistance.

In the typical bilayer resist process, the undercoat layer is applied on the substrate. The chemically amplified resist is then applied on the undercoat layer, exposed to deep UV light and developed to form images in the chemically amplified resist topcoat. The bilayer resist system is then placed in an oxygen plasma etch environment to etch the undercoat in the areas where the chemically amplified resist has been removed by the development. The chemically amplified resist in a bilayer system typically contains silicon and is thus able to withstand oxygen plasma etching. After the bottom layer is etched, the resist system can be used for subsequent processing such as non-oxygen plasma etch chemistry which removes the underlying substrate.

Even though the undercoat attenuates standing waves and substrate poisoning, it poses other problems. First, some undercoat layers are soluble to the chemical amplified resist solvent component. If there is intermixing between the top and undercoat layers, the resolution and sensitivity of the top resist layer will be detrimentally affected.

In addition, if there is a large difference in the index of refraction between the chemical amplified resist and the undercoat layer, light will reflect off the undercoat layer causing standing wave effects in the resist. Thus, the index of refraction between the two layers must be matched to minimize reflectivity effects.

Another problem with undercoating layers is that they are sometimes too absorbent because of incorporation of aromatic groups. Some semiconductor manufacturing deep UV exposure tools utilize the same wavelength of light to both expose the resist and to align the exposure mask to the layer below the resist. If the undercoat layer is too absorbent, the reflected light needed for alignment is too attenuated to be useful. However, if the undercoat layer is not absorbent enough, standing waves may occur. A formulator must balance these competing objectives.

In addition, some undercoats have very poor plasma etch resistance to plasma chemistry. The etch resistance of the undercoat should be comparable to the etch rate of novolak resins in order to be commercially viable.

Furthermore, some undercoat layers require UV exposure in order to form cross-links before the radiation sensitive resist topcoat layer can be applied. The problem with UV cross-linking undercoat layers is that they require long exposure times to form sufficient cross-links. The long exposure times severely constrain throughput and add to the cost of producing integrated circuits. The UV tools also do not provide uniform exposure so that some areas of the undercoat layer may be cross-linked more than other areas of the undercoat layer. In addition, UV cross-linking exposure tools are very expensive and are not included in most resist coating tools because of expense and space limitations.

Some undercoat layers are cross-linked by heating. However, the problem with these undercoat layers is that they require high curing temperatures and long curing times before the top layer can be applied. In order to be commercially useful, undercoat layers should be curable at temperatures below 250° C. and for a time less than 180 seconds. After curing, the undercoat should have a high glass transition temperature to withstand subsequent high temperature processing.

Therefore, it is an object of the present invention to provide a thermally curable polymer composition that is useful for an undercoat layer in deep UV lithography. Another object of the present invention is to provide an undercoat layer, which is cured at temperatures less than about 250° C. and for a time less than about 3 minutes. It is a further object of this invention to provide an undercoat layer which is insoluble to the top resist's solvent system, minimizes reflectivity effects, and has an etch rate comparable to novolaks.

Other and further objects, advantages and features of the present invention shall become apparent as described below.

SUMMARY OF THE INVENTION

The present invention is directed to a thermally curable polymer composition comprising a hydroxyl-containing polymer and a polyfunctional isocyanate as a cross-linking agent. The thermally curable polymer composition may be dissolved in a solvent and used as an undercoat layer in deep UV lithography.

In addition, the present invention also relates to a photolithographic coated substrate comprising: a substrate, a thermally cured undercoat composition on the substrate, and a radiation-sensitive resist topcoat disposed on the thermally cured undercoat composition. Furthermore, the present invention further relates to a process for using the photolithographic coated substrate for the production of relief structures.

DETAILED DESCRIPTION AND EMBODIMENTS

This invention relates to a thermally curable polymer composition, which may be used for forming an undercoat layer in deep UV lithography. The thermally curable polymer composition comprises a polyfunctional isocyanate cross-linking agent and a hydroxyl-containing polymer. The molar ratio of the polyfunctional isocyanate to the hydroxyl groups on the polymer is about 1:3 to 3:1 and preferably about 1:2 to 2:1. When the composition is heated, the isocyanate cross-links the polymer chains resulting into a thermally cured polymer matrix.

Any suitable polyfunctional isocyanate may be used as the cross-linking agent. The preferred polyfunctional isocyanates have the general formula:

$$O=C=N-Y-(-N=C=O)_n$$

wherein Y is a substituted or unsubstituted aromatic, aliphatic or cycloaliphatic polyvalent group and n is or 1 or more. Examples of suitable isocyanates are isophorone diisocyanate, 2,4-toluene diisocyanate, 1,3- and 1,4-cyclohexane diisocyanate, 1,2-ethylene diisocyanate, 1,4-tetramethylene diisocyanate, 1,6-hexamethylene diisocyanate, 2,2,4- and 2,4,4-trimethyl-1,6-hexamethylene diisocyanate, 1,12-dodecane diisocyanate, ω,ω'-diisocyanatodipropyl ether, 1,3-cyclobutane diisocyanate, 1,3- and 1,4-cyclohexane diisocyanate, 2,2- and 2,6-diisocynanato-1-methylcyclohexane, 2,5 and 3,5-bis (isocyanatomethyl)-8-methyl-1,4-methano-decahydronaphthalene, 1,5-, 2,5-, 1,6- and 2,6-bis (isocyantomethyl)-4,7-methanohexahydroindane, 1,5-, 2,5- and 2,6-bis (isocyanato)-4,7-methanehexahydroindane, 2,4'- and 4,4'-dicylohexyl diisocyanate, 2,4- and 2,6-hexahydrotolylene diisocyanate, perhydro-2,4'- and 4,4'-diphenylmethane diisocyanate, ω,ω'-diisocyanato-1,4-diethylbenzene, 1,3- and 1,4-phenylene diisocyanate, 4,4'-diisocyanatobiphenyl, 4,4'-diisocyanato-3,3'-dichlorobiphenyl, 4,4'-diisocyanato-3,3'-dimethoxybiphenyl, 4,4'-diisocyanato-3, 3'dimethylbiphenyl, 4,4'-diisocyanato-3,3'-diphenylbiphenyl, 2,4'- and 4,4'-diisocyanato diphenylmethane, naphthylene 1,5,-diisocyanate, 2,4- and 2,6-tolylene diisocyanate, N,N'-(4,4'-dimethyl-3,3'-diisocyanatodiphenyl)uretdione, m-xylylene diisocyanate, dicyclohexylmethane diisocyanate, tetramethylxylylene diisocyanate, 2,4,4'-triisocyanatodiphenyl ether, 4,4',4"-triisocyanatotriphenylmethane, and the like and mixtures thereof.

The thermally curable polymer composition also comprises a hydroxyl-containing polymer. Suitable examples of hydroxyl-containing polymers are polymers comprising monomer units selected from the group consisting of: cyclohexanol, hydroxyalkyl acrylate or methacrylate, hydroxycycloalkyl acrylate or methacrylate, hydroxyalkylcycloalkyl acrylate or methacrylate, allyl alcohol and the like. This invention also contemplates copolymers, terpolymers, etc. of the foregoing named polymers.

Preferably, polymers comprising monomer units of cyclohexanol, hydroxyalkyl acrylate or methacrylate, and hydroxycycloalkyl acrylate or methacrylate have a number average molecular weight of about 9000 to 38,000, more preferably about 14,000 to 30,000 and most preferably about 18,000 to 22,000.

In addition, the thermally curable polymer composition may also further comprise monomer units of cycloaliphatic esters of acrylic or methacrylic acid. Suitable examples of monomer units of cycloaliphatic esters of acrylic or methacrylic acid are cyclohexyl acrylate or methacrylate, 4-tert-butylcyclohexyl acrylate or methacrylate, isobomyl acrylate or methacrylate and adamantyl acrylate or methacrylate and the like. The preferred monomer units of cycloaliphatic ester of acrylic or methacrylic acid are isobornyl acrylate or methacrylate.

Furthermore, the hydroxyl-containing polymer may further comprise aromatic monomer units, preferably styrene.

In a preferred embodiment, the thermally curable polymer composition comprises monomer units of (a) a cycloaliphatic ester of acrylic or methacrylic acid; (b) a sole aliphatic ester of acrylic or methacrylic acid consisting of hydroxyalkyl acrylate or methacrylate; and (c) a polyfunctional isocyanate, wherein the polymer has a number average molecular weight of about 9000 to 38,000, preferably about 14,000 to 30,000, more preferably about 18,000 to 22,000.

Other preferred copolymers useful in the thermally curable polymer composition are a copolymer of styrene and allyl alcohol with a weight average molecular weight of about 2000 to 20,000, preferably 2,000 to 10000; and a terpolymer of hydroxyalkyl acrylate or methacrylate, cycloaliphatic esters of acrylic or methacrylic acid and styrene with a number average molecular weights of about 9000 to 38,000, preferably about 14,000 to 30,000, more preferably about 18,000 to 22,000.

Examples of suitable hydroxyalkyl acrylate or methacrylates are hydroxymethyl acrylate or methacrylate, 2-hydroxyethyl acrylate or methacrylate, 3-hydroxypropyl acrylate or methacrylate, 4-hydroxybutyl acrylate or methacrylate, 5-hydroxypentyl acrylate or methacrylate, and 6-hydroxyhexyl acrylate or methacrylate and the like. Preferably, the hydroxyalkyl acrylate or methacrylate contains primary hydroxyl groups, although secondary alcohol groups or mixtures of primary and secondary alcohol groups may be used. Suitable examples of secondary alcohols are 2-hydroxy-2-methylethyl acrylate or methacrylate, 3-hydroxy-3-methypropyl acrylate, 4-hydroxy-4-methylbutyl acrylate or methacrylate, 5-hydroxy-5-methyl propyl acrylate or methacrylate, and the like. The preferred hydroxyalkyl acrylate or methacrylate is 2-hydroxyethyl acrylate or methacrylate.

The thermally curable polymer composition of the present invention should not begin significant cross-linking until it reaches a temperature of about 50° C. Significant cross-linking below 50° C. may lead to gel formation at room temperature, which will reduce the composition's shelf life. Gel formation results in non-uniform coatings and linewidth variations across the substrate when the thermally curable polymer composition is used as an undercoat layer in microlithography.

The more preferable polymers of the present invention comprise polymers with the following monomer units:

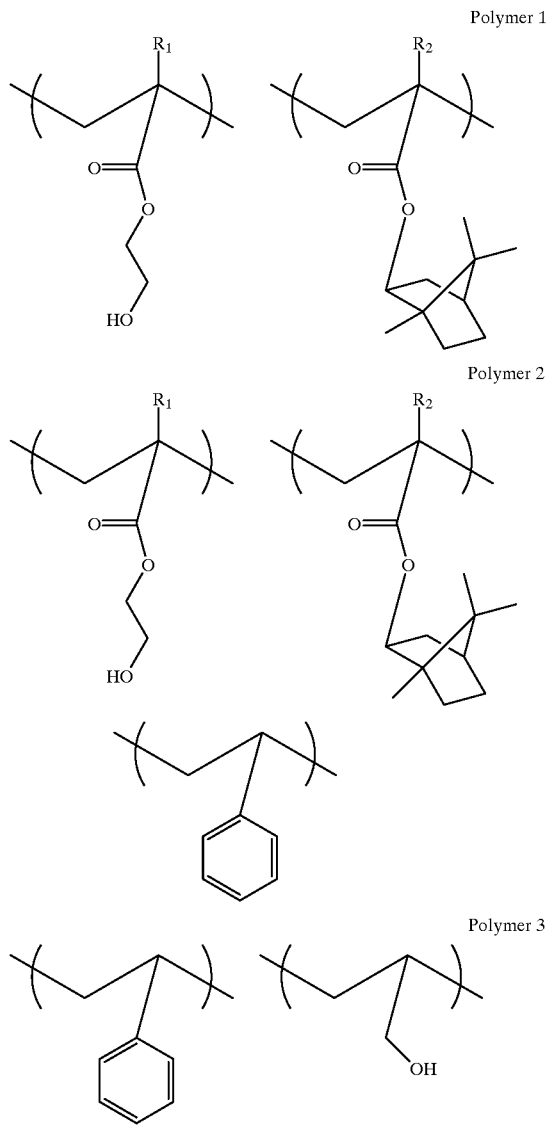

wherein $R_1$ and $R_2$ are independently selected from hydrogen or methyl.

Polymer 1 comprises about 60 to 80 mole % of isobornyl acrylate or methacrylate monomer units and about 20 to 40 mole % of 2-hydroxyethyl acrylate or methacrylate monomer units.

Polymer 2 comprises about 30 to 40 mole % of isobornyl acrylate or methacrylate monomer units, about 10 to 30 mole % of 2-hydroxyethyl acrylate or methacrylate monomer units, and about 30 to 50 mole % of styrene monomer units.

Polymer 3 comprises about 39–60 mole % of styrene monomer units and about 40 to 61 mole % of allyl alcohol monomer units.

The polymerization of the polymers described above may be carried out by any suitable polymerization process such as free radical polymerization. The number average molecular weight of the Polymers 1 and 2 are about 9,000 to 38,000, preferably about 14,000 to 20,000, and more preferable about 18,000 to 22,000.

The present invention also relates to a photolithographic coated substrate comprising: a substrate, a thermally cured undercoat composition on the substrate, and a radiation-sensitive resist topcoat on the thermally cured undercoat composition.

The thermally cured undercoat composition comprises the thermally curable polymer composition comprising a hydroxyl-containing polymer and a polyfunctional isocyanate cross-linking agent that has been heated to form a cross-linked matrix. Any of the polymers described above may be used as the hydroxyl-containing polymer. Preferably, the hydroxyl-containing polymer is selected from Polymers 1, 2 or 3.

The present invention further relates to a process for using the photolithographic coated substrate for the production of relief structures comprising the steps of: providing the photolithographic coated substrate, imagewise exposing the radiation-sensitive resist topcoat to actinic radiation; and forming a resist image by developing the radiation-sensitive resist topcoat with a developer to form open areas in the radiation-sensitive resist topcoat. In addition, the thermally cured undercoat composition may be removed in the open areas of the developed radiation-sensitive resist topcoat by any suitable process such as oxygen plasma etching to form an image in the thermally cured undercoat composition.

One advantage of the thermally curable polymer composition is that it may be cured at a temperature of less than about 250° C. and for a time less than about 180 seconds. This make it particularly useful as an undercoat layer for a resist system where temperature and time constraints are important for commercial viability.

Both the undercoat and the radiation-sensitive compositions are uniformly applied to a substrate by known coating methods. The compositions are solubilized in an organic solvent and the coatings may be applied by spin-coating, dipping, knife coating, lamination, brushing, spraying, and reverse-roll coating. The coating thickness range generally covers values of about 0.1 to more than 10 $\mu$m, and more preferably from about 0.1 to 1.5 $\mu$m for the radiation-sensitive resist and about 0.3 to 3.0 $\mu$m for the undercoat layer. After the coating operation, the solvent is generally removed by curing or drying.

Suitable solvents for both the undercoat and topcoat radiation-sensitive compositions include ketones, ethers and esters, such as methyl ethyl ketone, methyl isobutyl ketone, 2-heptanone, cyclopentanone, cyclehexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl ether acetate, propylene glycol methyl ether acetate, methyl lactate, ethyl lactate, methyl pyruvate, ethyl pyruvate, methyl 3-methoxypropionate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like.

The radiation-sensitive resist topcoat of the present invention may be any suitable radiation-sensitive resist. It is typically a chemically amplified resist sensitive to radiation in the deep UV region such as those referenced in U.S. Pat. Nos. 5,492,793 and 5,747,622. Preferably, for a bilayer resist system, the radiation-sensitive resist will contain silicon to protect it from oxygen plasma etching. A preferable radiation sensitive resist topcoat comprises a polymer comprising the following monomer units:

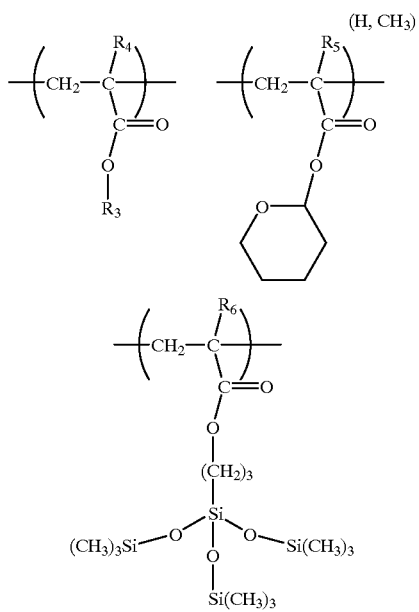

wherein $R_3$ is methyl or hydroxyethyl, $R_4$ is hydrogen, methyl or $CH_2CO_2CH_3$, and $R_5$ and $R_6$ are hydrogen or methyl, with each choice made independently.

The radiation-sensitive resist will also contain a photoacid generating (PAG) compound. The PAG compounds may be of any suitable type such as sulfonium or iodonium salts, nitrobenzyl esters, imidosulfonates esters and the like. Typically the PAG will be in an amount of about 1 to 10% based on the weight of the polymer.

For the production of relief structures, the radiation-sensitive resist is imagewise exposed to actinic radiation. The term 'imagewise' exposure includes both exposure through a photomask containing a predetermined pattern, exposure by means of a computer controlled laser beam which is moved over the surface of the coated substrate, exposure by means of computer-controlled electron beams, and exposure by means of X-rays or UV rays through a corresponding mask. The imagewise exposure generates acid in the exposed regions of the resist which cleaves the acid labile groups resulting in a polymer which is aqueous soluble. Typically, after imagewise exposure, the chemically amplified resist will be subjected to a post exposure heating treatment that virtually completes the reaction of the photoacid generator with the acid labile groups.

After imagewise exposure and any heat treatment of the material, the exposed areas of the top radiation-sensitive resist are typically removed by dissolution in a aqueous developer. The choice of the particular developer depends on the type of photoresist; in particular on the nature of the polymer resin or the photolysis products generated. The developer can comprise aqueous solutions of bases to which organic solvents or mixtures thereof may have been added. Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

The radiation-sensitive resist used for the bilayer process described above will typically contain silicon or have silicon incorporated into the resist after development. After images are formed in the radiation-sensitive resist, the substrate will be placed in an plasma-etching environment comprising oxygen so that the underlayer coating will be removed. The silicon incorporated in the radiation-sensitive resist forms silicon dioxide when exposed to an oxygen plasma and protects it from being etched so that relief structures can be formed in the undercoat layer.

After the oxygen plasma step, the substrate carrying the bilayer relief structure is generally subjected to at least one further treatment step which changes the substrate in areas not covered by the bilayer coating. Typically, this can be implantation of a dopant, deposition of another material on the substrate or an etching of the substrate. This is usually followed by the removal of the resist coating from the substrate typically by a fluorine/oxygen plasma etch.

This invention is explained below in further detail with reference to the following examples, which are not by way of limitation, but by way of illustration.

EXAMPLE 1

Synthesis Procedure for Polymer 1

In a 100 ml three-necked round bottom flask equipped with a magnetic stir bar, addition funnel, condenser, and nitrogen inlet-outlet was added a mixture of 24.0 g of isobornyl methacrylate, 6.0 g of 2-hydroxyethyl methacrylate 30 ml of tetrahydrofuran (THF) and 0.45 g of 2,2'-azobis(2-methylbutyronitrile). The mixture was heated to 65° C. and stirred for 18 hours. The solution was precipitated by addition to 1 liter of hexanes, and the precipitate was filtered. The solid was dried for 1 hour under a water aspirator vacuum, subsequently dissolved in 80 ml of THF and reprecipitated in 1 liter of hexanes. The precipitate was filtered, and the solid dried at 4 mbar for 24 hours. The yield of polymer was between 77–80%. Molecular weights and molecular weight distributions were measured using a Waters Corp. liquid chromatograph. The number average molecular weight was 36,930 and the polydispersity (Mw/Mn) was 2.15. Thermal decomposition measurements (TGA) were performed using a Perkin-Elmer thermal gravimetric analyzer (TGA-7) giving a weight loss of 51% between 260–380° C. The structure and composition of polymers was analyzed using a Bruker 250 MHz NMR-spectrometer. The mole % of isobornyl methacrylate was 74% and the mole % of 2-hydroxyethyl methacrylate was 26%.

EXAMPLE 2

Synthesis Procedure for Polymer 2

In a 100 ml three-necked round bottom flask equipped with a magnetic stir bar, addition funnel, condenser, and nitrogen inlet-outlet was added a mixture of 18 g of isobornyl methacrylate, 6.0 g of 2-hydroxyethyl methacrylate, 6.0 g of styrene, 30 ml of THF and 0.45 g of 2,2'-azobis(2-methylbutyronitrile). The mixture was heated to 65° C. and stirred for 18 hours. The solution was precipitated by the addition to 1 liter of hexanes, and the precipitate was filtered. The solid was dried for 1 hour under a water aspirator vacuum, subsequently dissolved in 60 ml of THF and reprecipitated in 1 liter of hexanes. The precipitate was filtered, and the solid dried at 4 mbar for 24 hours. The yield of polymer was between 77–80%. Molecular weights and molecular weight distributions were measured using a Waters Corp. liquid chromatograph. The number average molecular weight was 17,954 and the polydispersity was 2.05. Thermal decomposition measurements (TGA) were performed using a Perkin-Elmer thermal gravimetric analyzer (TGA-7) giving a 41% weight loss between 265–360° C. The structure and composition of polymers was analyzed using a Bruker 250 MHz NMR-spectrometer. The mole % of isobornyl methacrylate was 37%, the mole % of 2-hydroxyethyl methacrylate was 23% and the mole % of styrene was 40%.

EXAMPLE 3

Thermally Curable Polymer Composition Using Polymer 1

An 11% by weight thermally curable polymer composition was formulated by combining 9.90 g of Polymer 1 from Example 1 above, and 1.10 g of 2,4-toluene diisocyanate in 89 g of propylene glycol methyl ether acetate (PGMEA). The mixture was rolled overnight, and the undercoat solution was filtered twice through a 0.1 μm filter.

EXAMPLE 4

Thermally Curable Polymer Composition Using Polymer 2

An 11% by weight thermally curable polymer composition was formulated by combining 9.65 g of Polymer 2 from Example 2 above, and 1.35 g of 2,4-toluene diisocyanate in 89 g of PGMEA. The mixture was rolled overnight, and the undercoat solution was filtered twice through a 0.1 μm filter.

EXAMPLE 5

Thermally Curable Polymer Composition Using Polymer 3

A 16% by weight thermally curable polymer composition was formulated by combining 13.30 g of Polymer 3 obtained from Scientific Polymer Products, Inc. (i.e., 60 mole % styrene and 40 mole % allyl alcohol), and 2.70 g of 2,4-toluene diisocyanate in 84 g of PGMEA. The mixture was rolled overnight, and the undercoat solution was filtered twice through a 0.1 μm filter.

EXAMPLE 6

Preparation of Bilayer Resist

A silicon wafer was spin coated with the formulation of Example 3 and baked at 250° C. for 3 min to yield a 0.50 μm thick film. A radiation-sensitive resist topcoat was spin coated over the undercoat layer and baked at 100° C. for 1 min to yield a 0.25 μm thick film. The radiation-sensitive resist topcoat was a chemically amplified resist system comprising a terpolymer of tetrahydropyranylmethacrylate/ methyl methacrylate/methacryloxypropyl tris(trimethoxy) silane, a triphenylsulfonium-triflate PAG, a triphenylimidole base compound and PGMEA solvent. The coated wafer was then exposed using an ISI 248 nm wavelength stepper. The wafer was post exposure baked at 100° C. for 1 min and developed for 30 seconds in 0.262 N aqueous TMAH. The wafer was spun dry and the image was analyzed by scanning electron microscopy (SEM). The SEM's showed that there was no standing waves, and no intermixing of the undercoat and the imaging layer. The bilayer could resolve features as small as 0.18 μm. In addition, the glass transition temperature of the undercoat was greater than 250° C., which shows that it can withstand subsequent high temperature processing. Furthermore, the oxygen plasma etch rate of the undercoat was within 15% of the etch rate of novolaks.

The foregoing is illustrative of the present invention and is not construed as limiting thereof. The invention is defined by the following claims with equivalents of the claims to be included therein.

What is claimed is:

1. A photolithographic sensitive coated substrate suitable for imagewise exposure by deep UV radiation, said coated substrate comprising:
   (a) a substrate;
   (b) a thermally cured undercoat on the substrate, said thermally cured undercoat being a thermally cured polymer composition of a hydroxyl-containing polymer and a polyfunctional isocyanite cross-linking agent, wherein the hydroxyl-containing polymer comprises at least one monomer selected from the group consisting of: a hydroxyalkyl (meth)acrylate, a hydroxycycloalkyl (meth)acrylate, a hydroxyalkylcycloalkyl (meth)acrylate, and allyl alcohol, said thermally cured undercoat having been cured at a temperature within the range of above about 50° C. to less than about 250° C. for a time less than about 3 minutes;
   (c) a deep UV radiation-sensitive photoresist topcoat on said thermally cured undercoat, said radiation-sensitive topcoat comprising a topcoat of a photoresist composition comprising a chemically amplified deep UV photosensitive polymer containing acid-labile groups and a photoacid generating compound generating acid upon exposure to deep UV radiation.

2. The coated substrate of claim 1 wherein said hydroxyl-containing polymer of the undercoat has a number average molecular weight of about 9000 to 38,000.

3. The coated substrate of claim 2 wherein said hydroxyl-containing polymer of the undercoat has a number average molecular weight of about 14,000 to 30,000.

4. The coated substrate of claim 1 wherein the polyfunctional isocyanate has the general structure:

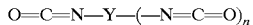

wherein Y is a substituted or unsubstituted aromatic, aliphatic or cycloaliphatic polyvalent group, and n is an integer of 1 or more.

5. The coated substrate of claim 1 wherein said hydroxyl-containing polymer comprises a monomer unit of allyl alcohol, said polymer having a weight average molecular weight of about 2000 to 10000.

6. The coated substrate of claim 1 wherein said hydroxyl-containing polymer further comprises a monomer unit selected from the group consisting of a cycloaliphatic ester of acrylic acid and a cycloaliphatic ester of methacrylic acid.

7. The coated substrate of claim 6 wherein said monomer unit of cycloaliphatic ester of acrylic acid and cycloaliphatic ester of methacrylic acid is selected from the group consisting of: cyclohexyl acrylate, cyclohexyl methacrylates, 4-tert-butylcyclohexyl acrylate, 4-tert-butylcyclohexyl methacrylate, isobornyl acrylate and isobornyl methacrylate and adamantyl acrylate, and adamantyl methacrylate.

8. The coated substrate of claim 1 wherein said hydroxyalkyl acrylate or hydroxyalkyl methacrylate is selected from the group consisting of: hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, 4-hydroxybutyl acrylate, 4-hydroxybutyl methacrylate, 5-hydroxypentyl acrylate, 5-hydroxypentyl methacrylate, 6-hydroxyhexyl acrylate, and 6-hydroxyhexyl methacrylate.

9. The coated substrate of claim 1 wherein said hydroxyl-containing polymer comprises monomer units selected from the group consisting of: hydroxyalkyl acrylate, hydroxyalkyl methacrylate, and allyl alcohol units.

10. The coated substrate of claim 9 wherein said hydroxyl-containing polymer further comprises monomer units selected from the group consisting of cycloaliphatic ester of acrylic and cycloaliphatic ester of methacrylic acid units.

11. The coated substrate of claim 1 wherein said hydroxyl-containing polymer comprises the following monomer units:

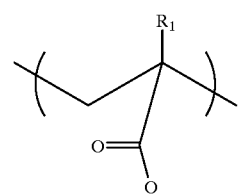
(A)

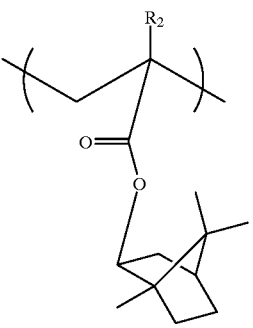
(B)

wherein $R_1$ and $R_2$ are independently a hydrogen or a methyl.

12. The coated substrate of claim 11 wherein the mole % of monomer unit (A) is about 20 to 40 mole %, and the mole % of monomer unit (B) is about 60 to 80 mole %.

13. The coated substrate of claim 1 wherein said hydroxyl-containing polymer comprises the following monomer units:

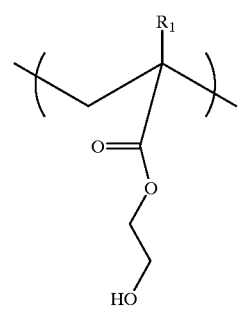
(A)

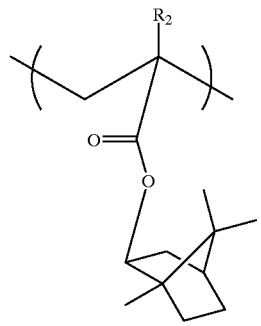
(B)

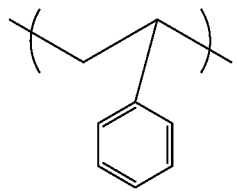
(C)

wherein $R_1$ and $R_2$ are independently a hydrogen or a methyl.

14. The coated substrate of claim 13 wherein the mole % of monomer unit (A) is about 10 to 30 mole %, the mole % of monomer unit (B) is about 30 to 40 mole %, and the mole % of monomer unit (C) is about 30 to 50 mole %.

15. The coated substrate of claim 1 wherein said hydroxyl-containing polymer comprises the following monomer units:

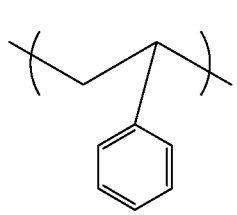
(C)

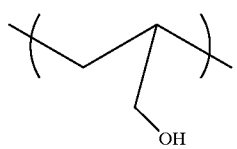
(D)

16. The coated substrate of claim 15 wherein the mole % of monomer unit (C) is about 39–60 mole % and the mole % of monomer unit (D) is about 40 to 61 mole %.

17. The coated substrate of claim 1 wherein said radiation-sensitive resist topcoat is a chemically amplified resist containing silicon.

18. The coated substrate of claim 17 wherein said radiation sensitive topcoat comprises a polymer comprising the following monomer units:

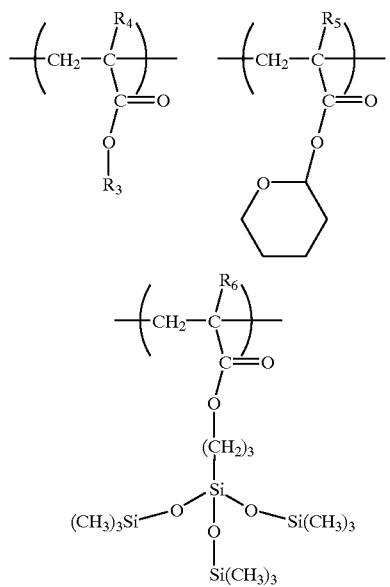

wherein $R_3$ is methyl or hydroxyethyl, $R_4$ is hydrogen, methyl or $CH_2CO_2CH_3$ and $R_5$ and $R_6$ are hydrogen or methyl, with each choice made independently.

19. A process for the production of relief structures comprising the steps of:
   (a) providing a photolithographic sensitive coated substrate; wherein said coated substrate comprises a substrate; a thermally cured undercoat on the substrate of claim 1;
   (b) imagewise exposing said radiation-sensitive resist topcoat to actinic radiation; and
   (c) forming a resist image by developing said radiation-sensitive resist topcoat with a developer.

20. The process of claim 19 wherein said hydroxyl-containing polymer comprises about 20 to 40 mole % of 2-hydroxyethyl acrylate or methacrylate monomer units and 60 to 80 mole % of isobornyl acrylate or methacrylate monomer units.

21. The process of claim 19 wherein said hydroxyl-containing polymer comprises about 10 to 30 mole % of 2-hydroxyethyl acrylate or methacrylate monomer units, about 30 to 40 mole % of isobornyl acrylate or methacrylate monomer units, and about 30 to 50 mole % styrene monomer units.

22. The process of claim 19 wherein said hydroxyl-containing polymer comprises about 39 to 60 mole % of styrene monomer units and about 40 to 61 mole % of allyl alcohol monomer units.

23. The process of claim 19 wherein said radiation sensitive resist topcoat comprises a polymer comprising the following monomer units:

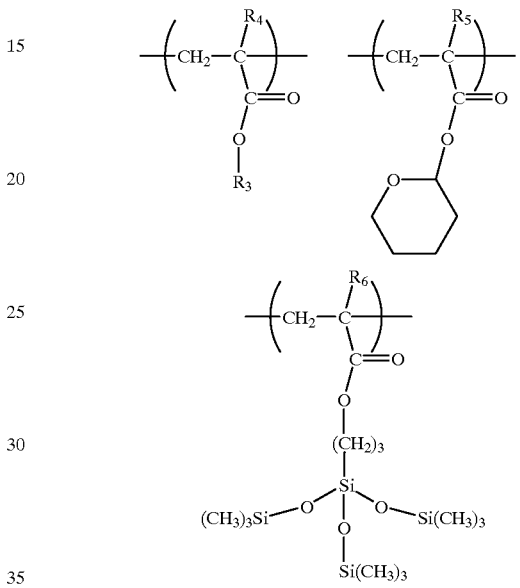

wherein $R_3$ is methyl or hydroxyethyl, $R_4$ is hydrogen, methyl or $CH_2CO_2CH_3$ and $R_5$ and $R_6$ are hydrogen or methyl, with each choice made independently.

* * * * *